(12) United States Patent
Raghunathan et al.

(10) Patent No.: US 7,932,757 B2
(45) Date of Patent: Apr. 26, 2011

(54) TECHNIQUES FOR MINIMIZING CONTROL VOLTAGE RIPPLE DUE TO CHARGE PUMP LEAKAGE IN PHASE LOCKED LOOP CIRCUITS

(75) Inventors: Ashwin Raghunathan, Santa Clara, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 12/367,969

(22) Filed: Feb. 9, 2009

(65) Prior Publication Data
US 2010/0117700 A1 May 13, 2010

Related U.S. Application Data

(60) Provisional application No. 61/114,041, filed on Nov. 12, 2008.

(51) Int. Cl.
*H03L 7/06* (2006.01)
(52) U.S. Cl. .......................... 327/158; 327/149
(58) Field of Classification Search .................. 327/149, 327/158
See application file for complete search history.

(56) References Cited

U.S. PATENT DOCUMENTS

| | | | |
|---|---|---|---|
| 5,920,233 A | 7/1999 | Denny | |
| 6,262,610 B1 * | 7/2001 | Lo et al. ........................ | 327/157 |
| 6,611,161 B1 * | 8/2003 | Kumar et al. .................. | 327/157 |
| 6,963,232 B2 * | 11/2005 | Frans et al. .................... | 327/156 |
| 7,038,509 B1 * | 5/2006 | Zhang ........................... | 327/157 |
| 7,132,865 B1 * | 11/2006 | Terrovitis et al. ............. | 327/157 |
| 7,132,896 B2 * | 11/2006 | Boerstler et al. .............. | 331/16 |
| 7,148,764 B2 * | 12/2006 | Kasahara et al. ............. | 331/179 |
| 7,209,009 B2 * | 4/2007 | Steinbach et al. ............. | 331/16 |

(Continued)

FOREIGN PATENT DOCUMENTS
EP 1511174 A1 3/2005

OTHER PUBLICATIONS

International Search Report and Written Opinion—PCT/US09/064267, International Search Authority—European Patent Office—Dec. 28, 2009.

*Primary Examiner* — Lincoln Donovan
*Assistant Examiner* — Adam D Houston
(74) *Attorney, Agent, or Firm* — Jiayu Xu

(57) ABSTRACT

Techniques for adaptively control of a loop filter sampling interval to mitigate the effects of charge pump leakage current in an apparatus including a phase lock loop circuit are provided. In one aspect, the apparatus includes a voltage controlled oscillator (VCO), a phase frequency detector (PFD) providing a phase comparison operation, a loop filter providing a control voltage to lock the VCO to a desired operating frequency, and a charge pump configured to provide an output signal to the loop filter in response to at least one of an UP pulse and a DOWN pulse. The apparatus further includes a sampling switch, coupled between an input of the loop filter, an output of the charge pump, and characterized by a sampling interval. A sampling switch controller is configured to adaptively control the width of the sampling interval in order to mitigate the effects of leakage current from the charge pump by closing the sampling switch in advance of the phase comparison operation and opening the sampling switch when the phase comparison operation is completed.

42 Claims, 5 Drawing Sheets

U.S. PATENT DOCUMENTS

| | | | |
|---|---|---|---|
| 7,248,086 B2 * | 7/2007 | Frans et al. | 327/147 |
| 7,265,636 B2 | 9/2007 | Dedieu et al. | |
| 7,317,345 B2 * | 1/2008 | Sanchez et al. | 327/527 |
| 7,446,595 B2 * | 11/2008 | Lee et al. | 327/536 |
| 7,449,928 B2 | 11/2008 | Kobayashi | |
| 7,671,642 B2 * | 3/2010 | Payrard et al. | 327/140 |
| 2003/0038661 A1 * | 2/2003 | Chokkalingam et al. | 327/157 |
| 2005/0248376 A1 * | 11/2005 | Boerstler et al. | 327/156 |
| 2006/0197563 A1 * | 9/2006 | Sanchez et al. | 327/156 |
| 2010/0085089 A1 * | 4/2010 | Weng et al. | 327/156 |

* cited by examiner

TECHNIQUES FOR MINIMIZING CONTROL VOLTAGE RIPPLE DUE TO CHARGE PUMP LEAKAGE IN PHASE LOCKED LOOP CIRCUITS

RELATED APPLICATIONS

CLAIM OF PRIORITY UNDER 35 U.S.C. §119

The present Application for Patent claims priority to Provisional U.S. Application Ser. No. 61/114,041, entitled "TECHNIQUES FOR MINIMIZING CONTROL VOLTAGE RIPPLE AND NOISE DUE TO CHARGE PUMP LEAKAGE IN PHASE LOCKED LOOP CIRCUITS," filed Nov. 12, 2008, assigned to the assignee hereof, and expressly incorporated herein by reference.

REFERENCE TO CO-PENDING APPLICATION FOR PATENT

The present Application for Patent is related to the following co-pending U.S. patent application entitled, "TECHNIQUES FOR MINIMIZING CONTROL VOLTAGE NOISE DUE TO CHARGE PUMP LEAKAGE IN PHASE LOCKED LOOP CIRCUITS", filed concurrently herewith, assigned to the assignee hereof, and expressly incorporated by reference herein.

TECHNICAL FIELD

The present disclosure relates generally to the field of electronic circuits, and more specifically to phase lock loop circuits.

BACKGROUND

FIG. 1 shows a schematic diagram of a typical phase lock loop (PLL) circuit employing a charge pump. A typical PLL circuit 100 consists of a phase frequency detector (PFD) 104 which detects a phase error, via a phase comparison, between a reference clock signal, denoted as REF_CLK, and a divided output clock from a divide-by-N divider 124. The PFD 104 generates and outputs UP and DOWN signals which drive a charge pump 106. The charge pump 106 injects a charge proportional to the detected phase error into a loop filter 116. The loop filter 116 then generates a control voltage $V_{ctrl}$ (or current) that is an input to a voltage (or current) controlled oscillator (VCO) 122. The VCO 122 generates a VCO output signal, denoted as VCO_CLK, whose frequency is proportional to the control voltage $V_{ctrl}$. It should be noted that the PFD 104 is clocked by the reference clock signal REF_CLK; i.e. the phase comparisons occur at the reference frequency interval.

The reference clock signal REF_CLK is a function of a clock signal from an external reference oscillator (not shown) and may be a fraction of the external reference oscillator, the fraction being derived by a divider (not shown) in a path between the external reference oscillator and the PFD 104.

In a locked condition, the UP and DOWN pulses are of substantially equal duration and no net charge is injected into the loop filter 116. Hence the control voltage $V_{ctrl}$ (or current) is ideally at a constant value which ensures that the VCO output signal VCO_CLK is at a constant frequency. The loop filter 116 typically accumulates a charge to produce a filtered control voltage that adjusts the VCO 122 output frequency.

The loop filter 116 is shown to include a first order loop filter implementation that comprises a series combination of a resistor ($R_{FILT}$) 118 and a capacitor ($C_{FILT}$) 120 in parallel with the charge pump 106 output. The loop filter 116 is only exemplary and may also include other components. For example, commonly an extra pole capacitor (not shown) is placed in parallel with the charge pump 106 output. The extra pole capacitor may be 1/10 the value of capacitor 120. The extra pole capacitor does not affect PLL 100 settling time or loop stability, but improves reference spur rejection in the VCO 122 output signal.

The charge pump 106 includes current sources 108 and 114 and switches 110 and 112. The switch 110 when closed passes the UP pulse to the loop filter 116. The switch 112 passes the DOWN pulse to the loop filter 116 when closed. The output of the PFD 104 controls the charge pump 106 so as to increase or decrease the control voltage $V_{ctrl}$ (or current) to the VCO 122 input.

FIG. 2 shows a set of waveforms 200 for a reference clock signal REF_CLK, a VCO output signal VCO_CLK, UP and DOWN pulses, and a control voltage $V_{ctrl}$ "ripple" associated with the PLL circuit 100 of FIG. 1. The waveform of the control voltage $V_{ctrl}$ illustrates a voltage droop due to the charge pump leakage in an OFF state. The voltage droop corresponds to a sloped (decreasing) waveform of the control voltage $V_{ctrl}$ which begins after a falling transition of the UP or DOWN pulses and continues to droop until a beginning of the next REF_CLK rising edge or beginning of a rising transition of the UP pulse. The waveform of the control voltage $V_{ctrl}$ is measured at a node $V_{ctrl}$ of the loop filter 116. In order to compensate for the voltage droop, the UP pulse is extended to compensate for the charge lost due to the leakage. The extended portion of the UP pulse is shown hatched in the waveform. Thus, the control voltage $V_{ctrl}$ gradually increases until the rising transition of the DOWN pulse. During the interval of the DOWN pulse, the control voltage $V_{ctrl}$ remains substantially at a constant level. The waveform of the VCO output signal VCO_CLK represents the modulation of the output frequency (VCO output signal) of the VCO 122 due to the voltage droop or voltage ripple on the control voltage $V_{ctrl}$. During a lock condition, the control voltage $V_{ctrl}$ is ideally a constant or DC voltage. Any periodic deviation from this DC or average value is said to be a ripple.

In current nanometer processes, the leakage current of a transistor in the "off" state can be quite significant. The charge pump 106 within PLL 100 is typically implemented using transistor based current sources that are turned on for the duration of the UP or DOWN pulses and are turned off otherwise. However the leakage current of these transistors in the OFF state can significantly alter the charge accumulated onto the loop filter 116. The PLL circuit 100 has to ensure that the locked condition is maintained by compensating for this charge loss due to leakage. The compensation is accomplished by the injection of an equal and opposite amount of extra charge at the beginning of each phase comparison. The leakage current charge loss and compensation charge introduces voltage "ripple" on the control voltage $V_{ctrl}$ to the voltage controlled oscillator (VCO) which manifests as deterministic jitter in the time domain or reference spurs in the frequency domain on the VCO output signal VCO_CLK of the VCO 122. Both effects can be undesirable depending on the target application. The undesirable effects are further exacerbated in low voltage designs that typically use high voltage or current gain VCO architectures to maximize the tuning range (i.e. to generate a wide range of frequencies from a limited control voltage or current range).

In one solution to lower the leakage current, thick-oxide transistors are employed in the charge pump. However, the option of using thick-oxide transistors may not be available in a particular integrated circuit process technology or may require the use of costly extra mask process steps. In another solution, a large loop capacitance is used to minimize voltage change for a given leakage current which results in an integrated circuit area and cost penalty.

There is therefore a need to mitigate charge pump leakage current without the expense of thick oxide transistors or a large loop capacitor on-chip.

There is also a need for a circuit that reduces the effect of a charge pump leakage in a phase lock loop with the minimum integrated circuit cost and area penalty.

SUMMARY

Techniques to adaptively control the loop filter sampling interval to mitigate the effects of charge pump leakage current in an apparatus including a phase lock loop circuit are provided. In one aspect, the apparatus includes a voltage controlled oscillator (VCO), a phase frequency detector (PFD) providing a phase comparison operation, a loop filter configured to provide a control voltage to lock the VCO to a desired operating frequency, and a charge pump configured to provide an output signal to the loop filter in response to at least one of an UP pulse and a DOWN pulse. The apparatus further includes a sampling switch, coupled between an input of the loop filter, an output of the charge pump, and characterized by a sampling interval. A sampling switch controller is configured to adaptively control the width of the sampling interval in order to mitigate the effects of leakage current from the charge pump by closing the sampling switch in advance of the phase comparison operation and opening the sampling switch when the phase comparison operation is completed.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

Figure 1:
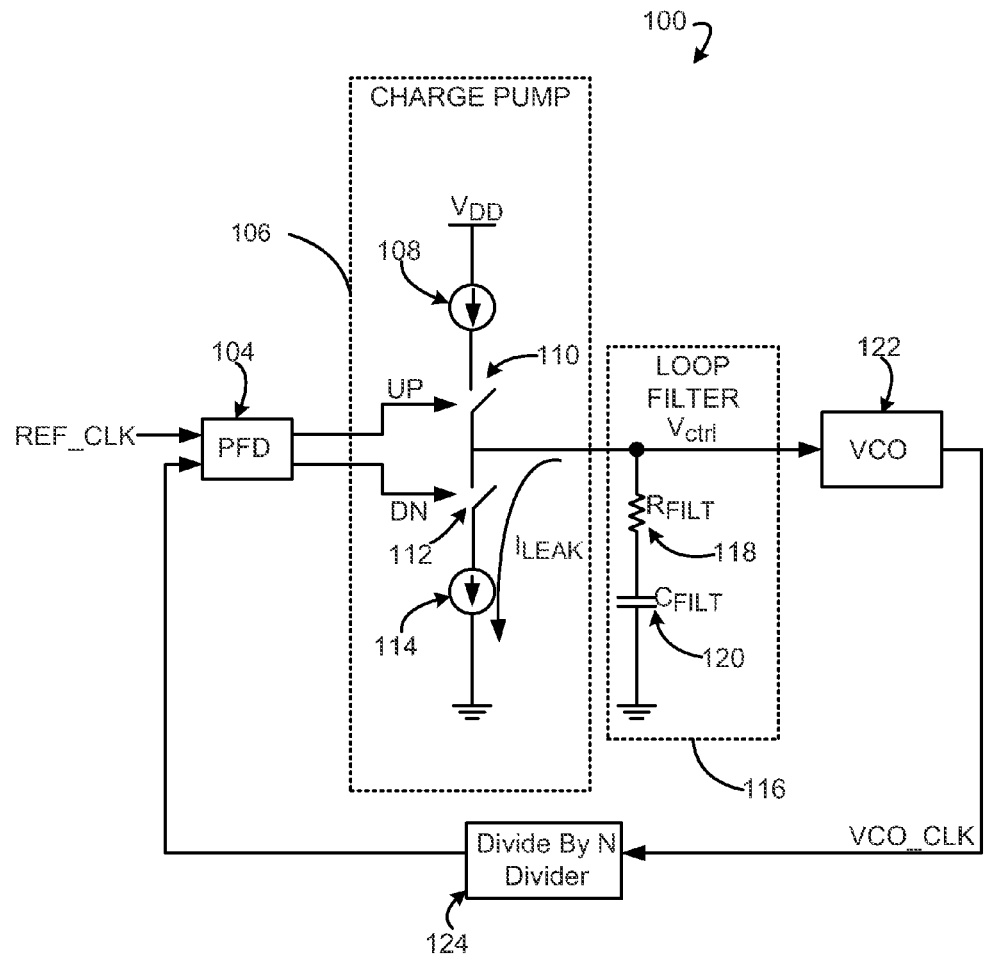
FIG. 1 shows an example schematic diagram of a typical phase lock loop (PLL) circuit employing a charge pump.
Figure 2:
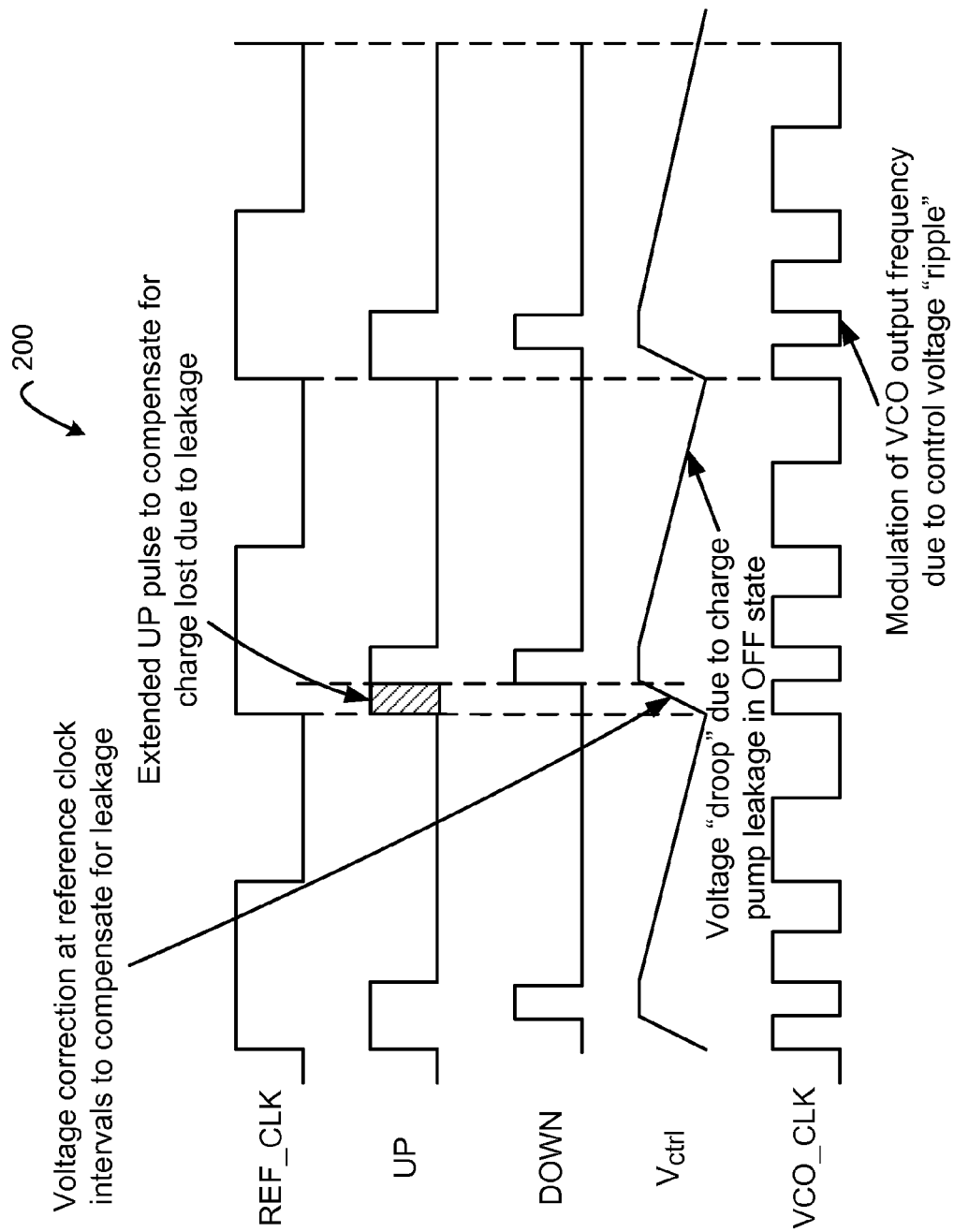
FIG. 2 shows an example set of waveforms for a reference clock, a VCO output signal, UP and DOWN pulses, and a control voltage "ripple" associated with the PLL circuit of FIG. 1.

To facilitate understanding, identical reference numerals have been used, where possible to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any configuration or design described herein as "exemplary" is not necessarily to be construed as preferred or advantageous over other embodiments or designs.

Figure 3:
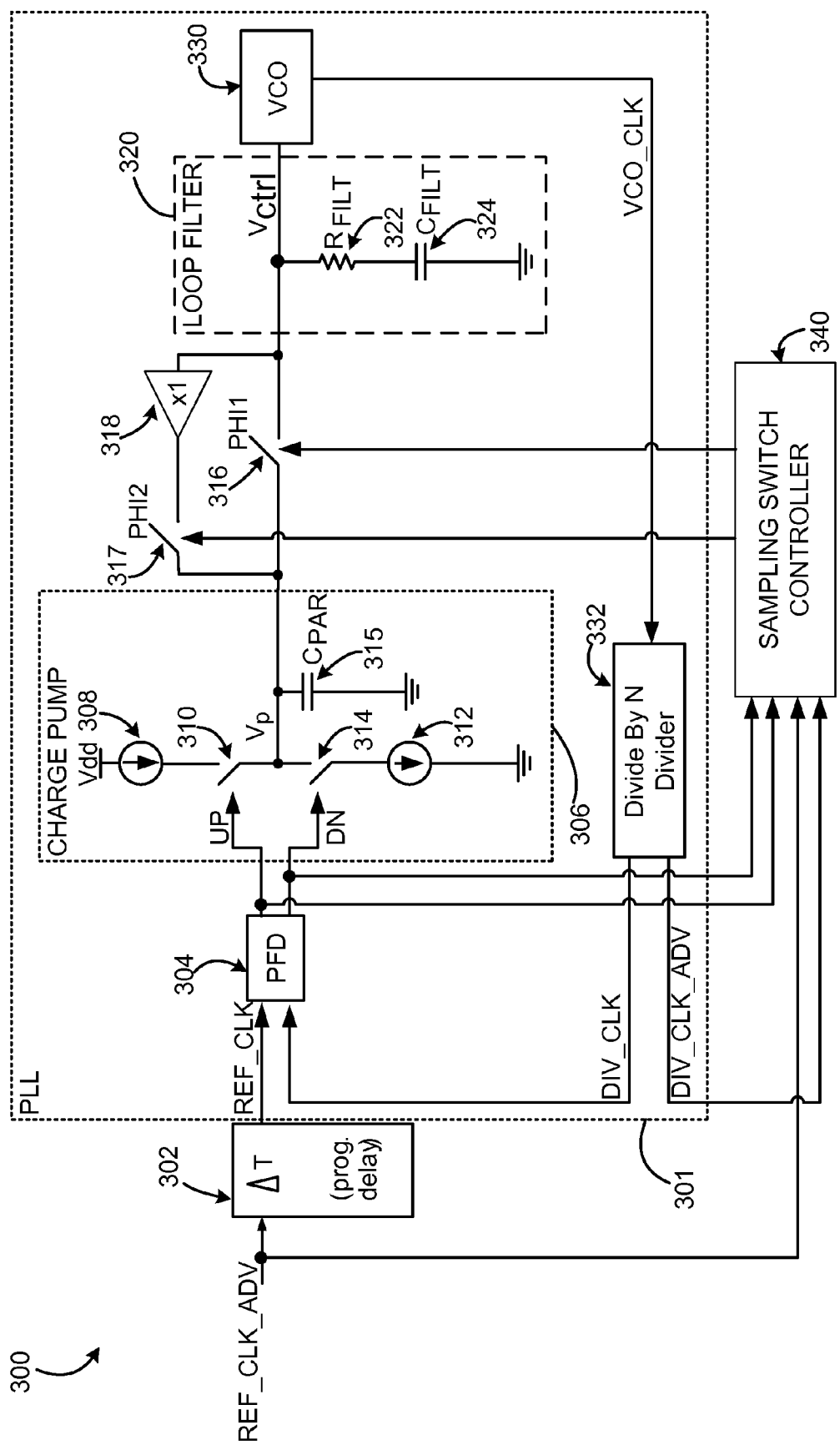
FIG. 3 shows an example schematic diagram of an apparatus having charge-pump phase lock loop (PLL) circuit with adaptive control of a loop filter sampling interval to mitigate the effects of charge pump leakage.

FIG. 3 shows a schematic diagram of an apparatus 300 having a charge-pump phase lock loop (PLL) circuit 301 with adaptive control of a loop filter sampling interval to mitigate the effects of a charge pump leakage current. The apparatus 300 includes a charge-pump PLL circuit 301, a programmable delay 302 and a sampling switch controller 340. The programmable delay 302 receives an advanced version of a reference clock signal, denoted as REF_CLK_ADV. The advanced version of the reference clock signal is hereinafter referred to as an "advanced reference clock signal." An output of the programmable delay 302 represents the reference clock signal, denoted as REF_CLK, which is an input into the PLL circuit 301.

The PLL circuit 301 includes a phase frequency detector (PFD) 304, a charge pump 306, a loop filter 320, a voltage (or current) controlled oscillator (VCO) 330 and a divide-by-N divider 332. In operation, the PFD 304 detects a phase error, via a phase comparison, between the reference clock signal REF_CLK and a divided output clock from the divide-by-N divider 332. The PFD 304 generates and outputs UP and DOWN pulses which drive the charge pump 306.

The advanced reference clock signal REF_CLK_ADV, and advanced divider clock signal DIV_CLK_ADV, and the UP and DOWN pulses are sent to a sampling switch controller 340. The outputs of sampling switch controller, denoted as PHI1 and PHI2, are configured to synchronize a sampling interval of the loop filter 320 via sampling switches 316 and 317 (both depicted in an open state). The sampling switch 316 is positioned between the charge pump 306 output and the loop filter 320 input. In one configuration, the sampling switch controller 340 is a state machine.

Figure 5:
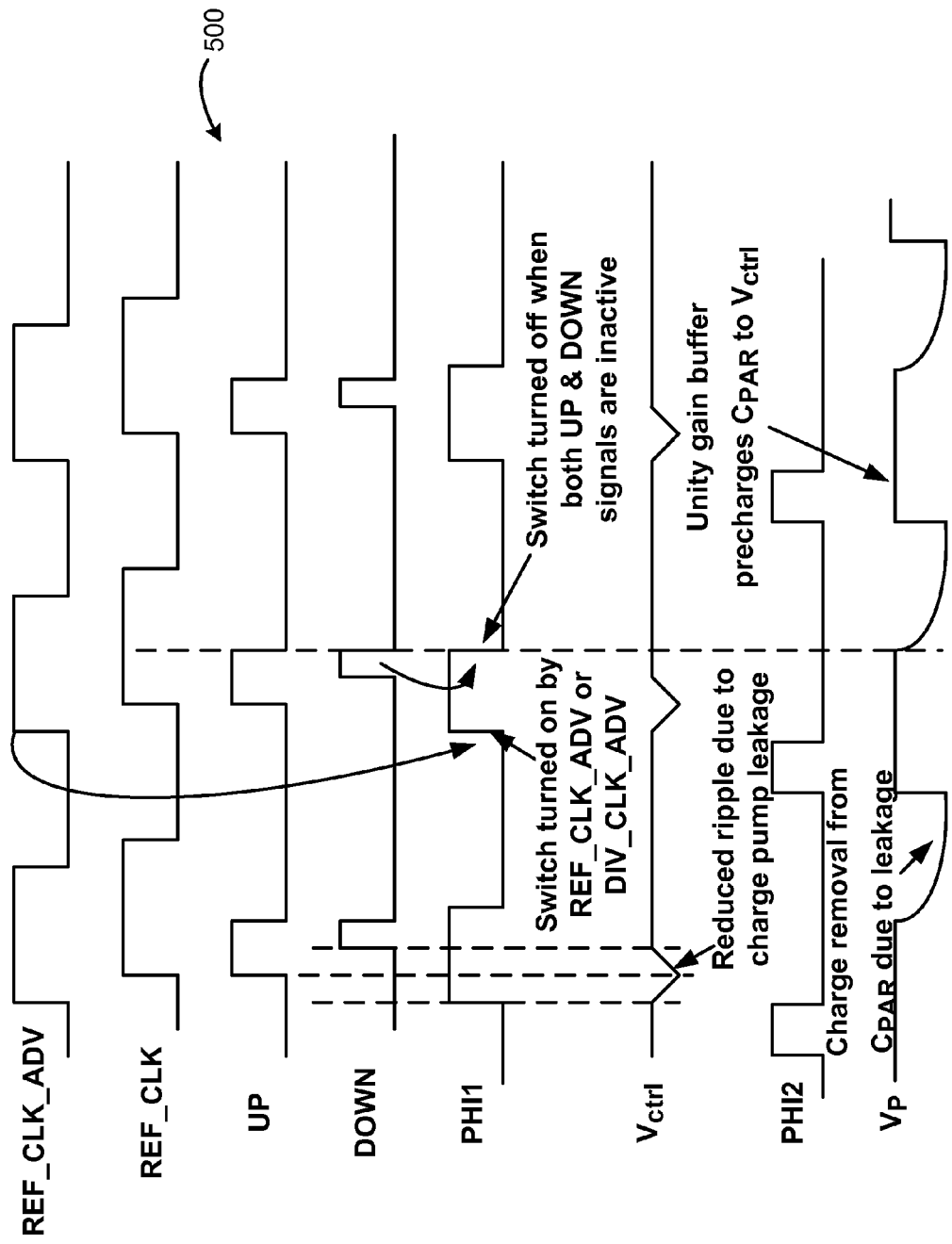
FIG. 5 shows a set of waveforms for a reference clock, an advanced reference clock, UP and DOWN pulses, switch control signals PHI1 and PHI2, charge pump output voltage $V_p$, and VCO control voltage Vctrl according to the apparatus of FIG. 3.

In the example configuration shown in FIG. 3, a sampling switch 317 is positioned between a unity gain amplifier 318 output and the charge pump 306 output. The purpose of the sampling switch 317 and unity gain amplifier 318 is to pre-charge the charge pump 306 output voltage, $V_p$, to the loop filter output voltage, $V_{ctrl}$, to mitigate charge pump 306 output leakage across parasitic capacitor 315 ($C_{PAR}$). Prior to closing sampling switch 316; sampling switch 317 is opened as shown in FIG. 5. The sampling switch 317, unity gain amplifier 318 and PHI2 control signal are optional and the benefit of pre-charging the charge pump 306 output is dependent on the value of the parasitic capacitor 315 ($C_{PAR}$).

The charge pump 306 injects a charge proportional to a detected phase error into the loop filter 320 when the sampling switch 316 is closed. The loop filter 320 then generates a control voltage $V_{ctrl}$ (or current) that is a frequency control input to the VCO 330. The VCO 330 generates a VCO output signal, denoted as VCO_CLK, whose frequency is proportional to the control voltage $V_{ctrl}$ (or current).

The PLL circuit 301 has a locked condition and a lock acquisition phase to achieve the locked condition. In the locked condition, the UP and DOWN pulses are of substantially equal duration and no net charge is injected into the loop filter 320. Hence the control voltage (or current) $V_{ctrl}$ is ideally at a constant value which ensures that the VCO 330 output signal VCO_CLK is at a constant frequency.

The loop filter 320 may include a capacitor ($C_{FILT}$) 324 and a resistor ($R_{FILT}$) 322 which accumulates charge to produce a control voltage that "sets" a control frequency which provides a correction voltage (if needed) at every phase comparison. It should be noted that the PFD 304 is clocked by the reference clock signal REF_CLK, i.e. the phase comparisons occur at reference frequency intervals.

The apparatus 300 may further include an external reference oscillator (not shown). The advanced reference clock signal REF_CLK_ADV is a function of a clock signal from the external reference oscillator (not shown) and may be a fraction of the external reference oscillator, the fraction being derived by a divider (not shown) in a path between the external reference oscillator and the programmable delay 302.

The loop filter 320 is only exemplary and may also include other components and other designs. For example, commonly an extra pole capacitor (not shown) is added in the loop filter 320. The extra pole capacitor may be 1/10 the value of capacitor 324. The extra pole capacitor does not affect PLL 301 settling time or loop stability, but improves reference spur rejection in the VCO 330 output signal. Likewise, the charge pump configuration is only exemplary.

From a leakage perspective, a sampling operation corresponding to the loop filter sampling interval should have of a minimum duration, i.e. the loop filter 320 is connected to the charge pump only when the UP or DOWN pulses are active (ON) and disconnected otherwise. In the locked condition, the UP and DOWN pulses are of minimum duration, i.e. a minimum pulse width is always maintained for both pulses to avoid an appearance of a dead-zone whereby the PFD 304 does not respond to very small phase errors. However, during a lock acquisition phase, the UP and DOWN pulses can be very long (a significant fraction of the reference cycle) which also sets a minimum constraint on a duration of the sampling operation by the sampling switch 316. If sampling switch 316 is turned off while the UP and DOWN pulses are still active (ON), some of the error charge is "lost" and the effective loop gain is reduced. Thereby, loop dynamics are changed and stability issues may arise.

The apparatus 300 described herein may be used for various electronics circuits including communication circuits. For example, the apparatus 300 may be used in (1) a transmitter subsystem to generate a local oscillator (LO) signal used for frequency upconversion, (2) a receiver subsystem to generate an LO signal used for frequency downconversion, (3) a digital subsystem to generate clock signals used for synchronous circuits such as flip-flops and latches, and (4) other circuits and subsystems.

Figure 4:
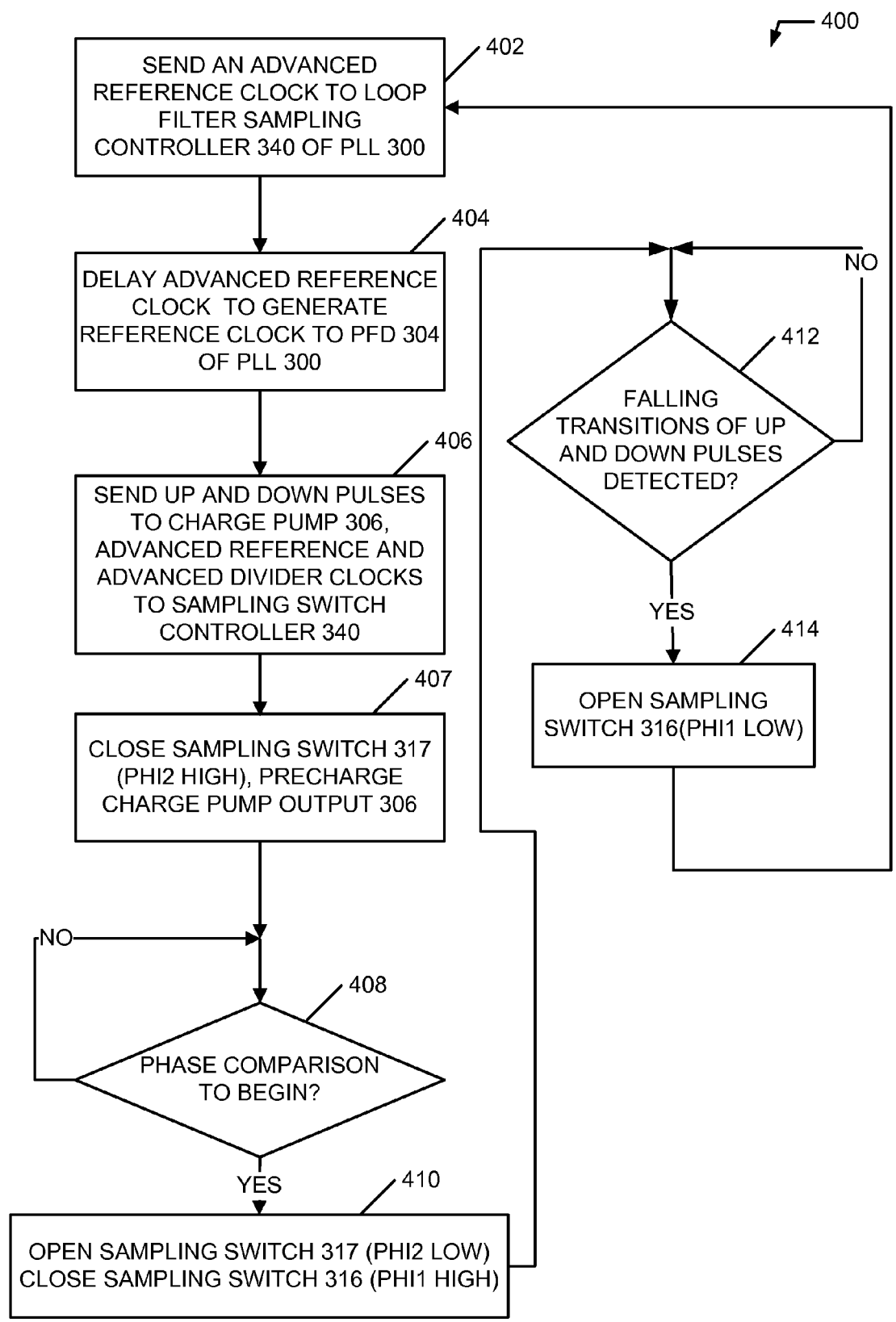
FIG. 4 shows a flowchart of an example process for adaptive control of a sampling interval for the loop filter.

FIG. 4 shows a flowchart of an example process 400 for adaptive control of a loop filter sampling interval of loop filter 320 to minimize the time the loop filter 320 is connected to any potential leakage paths in a charge pump 306. The process 400 may be implemented in a hardware state machine or hardware logic function. The sampling interval is controlled by a sampling switch controller 340. In the exemplary embodiment, there are shown two sampling switches 316 and 317 which are synchronized to open and close, via the switch controller 340, in accordance with the process 400.

The process 400 begins with sending an advanced reference clock signal REF_CLK_ADV to the sampling switch controller 340 of block 402. At block 404, the advanced reference clock signal REF_CLK_ADV is delayed by a programmable delay 302 to generate the reference clock signal REF_CLK to PFD 304. At block 406, the PFD 304 sends UP and DOWN pulses to the charge pump 306 and to the sampling switch controller 340. Divide by N Divider 332 sends advanced divider clock DIV_CLK_ADV to the sampling switch controller 340. At block 407, the switch controller 340 closes sampling switch 317 (PHI2 HIGH) to pre-charge the charge pump 306 output utilizing a combination of DIV_CLK_ADV and REF_CLK ADV signals to generate PHI2 pre-charge pulses.

At block 408, a determination is made whether the phase comparison (or next cycle) is to begin. If the determination is NO, the process 400 loops to the beginning of block 408. However, if the determination at block 408 is YES, the sampling switch 317 is opened (PHI2 LOW) and sampling switch 316 is closed (PHI1 HIGH) at block 410 which corresponds to the beginning of the loop filter sampling interval. At block 412, a determination is made whether falling transitions of both UP and DOWN pulses have been detected. If the determination is NO, block 412 loops back to the beginning of block 412. However, if the determination is YES, the sampling switch 316 is opened at block 414 which corresponds to the end of the loop filter sampling interval. Block 414 loops back to block 402.

The process 400 adaptively controls the width of the loop filter sampling interval (duration the sampling switch 316 is closed) based on a length of the UP and DOWN pulses, i.e. the loop filter sampling interval is automatically adjusted to accommodate for long UP/DOWN pulses (during the lock acquisition phase) and to accommodate for a minimum length UP/DOWN pulses (in the locked condition).

The reference clock signal REF_CLK to the PLL circuit 300 is delayed by a programmable amount. The sampling switch controller 340 is clocked when the advanced reference clock signal REF_CLK_ADV or advanced divider clock signal DIV_CLK_ADV is turned ON where the sampling switch 316 is closed just before the phase comparison instant. The sampling switch controller 340 then waits for the falling transitions of the UP and DOWN pulses to occur—once both these events are detected, the sampling switch 316 is opened. Thus, process 400 ensures that substantially all the error charge has been sampled onto the loop filter 320 while simultaneously minimizing the time for which the loop filter 320 is connected to any potential leakage paths in the charge pump 306. A resultant control voltage $V_{ctrl}$ remains constant once the sampling switch 316 is opened until the next phase comparison where the advanced reference clock REF_CLK_ADV or the advanced divider clock DIV_CLK_ADV (whichever occurs first) is turned ON.

The feedback path of unity gain amplifier 318 and sampling switch 317 is utilized to pre-charge the charge pump 306 output prior to phase comparisons between REF_CLK and DIV_CLK. The feedback circuit is required if $C_{PAR}$ 315 is present on the charge pump output to prevent charge sharing between $C_{FILT}$ and $C_{PAR}$ when the sampling switch 316 (PHI1 HIGH) is closed at the next phase comparison instant.

FIG. 5 shows a set of waveforms 500 for a reference clock signal REF_CLK, an advanced reference clock signal REF_CLK_ADV, UP and DOWN pulses, switch controls PHI1 and PHI2, a charge pump 306 output voltage $V_p$, and a control voltage $V_{ctrl}$ associated with the apparatus 300 of FIG. 3.

The switch control PHI1 is a synchronized sampling switch control that has a rising transition that corresponds to the rising transition of the advanced reference clock signal REF_CLK_ADV or the advanced divider clock signal DIV_CLK_ADV (whichever occurs first) Moreover, the falling transitions of the UP and DOWN pulses and the switch control PHI1 coincide. In operation, the sampling switch controller 340 switches ON (closes) the sampling switch 316 (corresponding to the rising transition of the switch control PHI1) based on the advanced reference clock signal REF_CLK_ADV or the advanced divider clock signal DIV_CLK_ADV being ON (whichever occurs first). Furthermore, the sampling switch controller 340 switches OFF (opens) the sampling switch 316 (corresponding to the falling transition of the switch control PHI1) which is synchronized to correspond to the falling transition of the UP and DOWN pulses. Thus, the sampling switch 316 is turned ON just before the phase comparison operation by the PFD 304 takes place and turned OFF once the phase comparison operation is completed.

The switch control PHI2 is a synchronized sampling switch control that has a falling transition that corresponds to the rising transition of the PHI1 signal. The PHI2 pulse duration can be as long as the PHI1 low period or as short as required to pre-charge the charge pump 306 output node, $V_p$. In operation, the sampling switch controller 340 switches ON (closes) the sampling switch 317 (corresponding to the rising transition of the switch control PHI2) based on the advanced reference clock signal REF_CLK_ADV and advanced divider clock signal DIV_CLK_ADV being OFF. Furthermore, the sampling switch controller 340 switches OFF (opens) the sampling switch 317 (corresponding to the falling transition of the switch control PHI2) which is synchronized to correspond to the rising transition of sampling switch 316 (PHI1 HIGH). Thus, the sampling switch 317 is turned ON prior to the phase comparison operation to pre-charge charge pump 306 output, $V_p$, and turned OFF once the phase comparison operation has started (PHI1 rising transition).

In operation, a voltage droop in the control voltage $V_{ctrl}$, represented by the decreasing slope (voltage vs. time) from the charge pump leakage, is essentially limited to the duration between a rising transition of the advanced reference clock signal REF_CLK_ADV to an ON state and rising transitions of the UP or DOWN pulse. Then, the control voltage $V_{ctrl}$, represented by the increasing slope, rises until a rising transition of the DOWN pulse. Thereafter, the control voltage $V_{ctrl}$ is essentially constant until the next rising transition of the advanced reference clock signal REF_CLK_ADV to an ON state. In the illustrated example of FIG. 5, assume that the charge pump leakage current tries to remove charge stored on the loop filter capacitor 324. Another analysis can be done for the case when the charge pump leakage current polarity is reversed, i.e. the leakage current tries to add extra charge onto the loop filter 320.

The apparatus 300 described therein mitigates the effect of charge pump leakage in a PLL 300 utilizing process 400 and timing diagram 500. Additionally, the apparatus 300 decouples the charge pump 306 output from the loop filter 320 and VCO 330 at all times other than the phase comparison instant. In instances where there is power supply noise present at the charge pump 306 (Vdd node), the power supply noise will be further mitigated by the PHI1 active duty cycle (portion of the PHI1 clock period that is high in %).

The apparatus 300 described herein may be used for various systems and applications. For example, the apparatus 300 may be used for wireless communication systems such as cellular systems, orthogonal frequency division multiple access (OFDMA) systems, multiple-input multiple-output (MIMO) systems, wireless local area networks (WLANs), and so on. The cellular systems include Code Division Multiple Access (CDMA) systems, Global System for Mobile Communications (GSM) systems, and so on. The CDMA systems include IS-95, IS-2000, IS-856, and Wideband-CDMA (W-CDMA) systems. The apparatus 300 may be embedded in a wireless device as well as a base station. For a time division duplexed (TDD) system that transmits and receives at different times, such as a GSM system or an IEEE 802.11 system, one apparatus 300 with the PLL circuit 301 may be used for both the transmit and receive paths. For a frequency division duplexed (FDD) system that transmits and receives at the same time on different frequency bands, such as a CDMA system, one apparatus 300 with the PLL circuit 301 may be used for the transmit path and another may be used for the receive path.

The apparatus 300 described herein may be implemented in various configurations. For example, all or many of the circuit blocks for the apparatus 300 and/or PLL circuit 301 may be implemented within an integrated circuit (IC), an RF integrated circuit (RFIC), an application specific integrated circuit (ASIC), and so on. The apparatus 300 may also be implemented with a combination of one or more ICs, discrete components, and so on. The apparatus 300 may also be fabricated with various IC process technologies such as complementary metal oxide semiconductor (CMOS), bipolar junction transistor (BJT), bipolar-CMOS (BiCMOS), silicon germanium (SiGe), gallium arsenide (GaAs), and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a voltage controlled oscillator (VCO);
a phase frequency detector (PFD) to provide a phase comparison operation;
a loop filter to generate a control voltage to lock the VCO to a desired operating frequency;
a charge pump to generate an output signal to the loop filter in response to at least one of an UP pulse and a DOWN pulse;
a sampling switch, coupled to an input of the loop filter and an output of the charge pump, and characterized by a sampling interval;
a sampling switch controller to adaptively control a width of the sampling interval to mitigate effects of leakage current from the charge pump by closing the sampling switch in advance of the phase comparison operation and opening the sampling switch when the phase comparison operation is completed, wherein the sampling switch controller is configured to receive an advanced reference clock signal and an advanced divider clock signal and to control the sampling switch to close just before the phase comparison operation by the PFD and to open just after the phase comparison operation thereby ensuring that all error charge has been sampled onto the loop filter while simultaneously minimizing a duration for which the loop filter is connected to potential leakage paths in the charge pump; and
a programmable delay coupled to the PFD and configured to receive the advanced reference clock signal and to delay the advanced reference clock signal to produce a reference clock signal,
wherein the PFD is configured to perform the phase comparison operation in response to the reference clock signal.

2. The apparatus of claim 1, wherein the sampling switch controller is further configured to adaptively control the width of the sampling interval for a duration based on a length of both UP and DOWN pulses to the charge pump.

3. The apparatus of claim 1, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

4. The apparatus of claim 3, wherein the sampling switch controller is further configured to adaptively control the width of the sampling interval as a function of a maximum length of either the UP and DOWN pulses, depending on which of the UP pulse and the DOWN pulse is longest, in a locked condition.

5. The apparatus of claim 1, wherein the sampling switch controller is further operable to detect for falling transitions of the UP and DOWN pulses to occur; and in response to detecting the falling transitions of both the UP and DOWN pulses, control the sampling switch to open.

6. The apparatus of claim 1, wherein the sampling switch controller is further operable to pre-charge the charge pump output node to the control voltage present at the loop filter prior to phase comparison operation.

7. The apparatus of claim 5, wherein the PFD is further configured to produce the UP and DOWN pulses.

8. The apparatus of claim 7, wherein a resultant control voltage from the loop filter to the VCO remains constant once the sampling switch is opened until a next cycle where the advanced reference clock signal or the advanced divider clock (whichever occurs first) is turned ON.

9. An integrated circuit comprising:
a voltage controlled oscillator (VCO);
a phase frequency detector (PFD) to provide a phase comparison operation;
a loop filter to generate a control voltage to lock the VCO to a desired operating frequency;
a charge pump to generate an output signal to the loop filter in response to at least one of an UP pulse and a DOWN pulse;
a sampling switch, coupled to an input of the loop filter and an output of the charge pump, and characterized by a sampling interval;
a sampling switch controller to adaptively control a width of the sampling interval to mitigate effects of leakage current from the charge pump by closing the sampling switch in advance of an ON state of the UP pulse or the DOWN pulse, depending on which of the UP pulse and DOWN pulse occurs first, and opening the sampling switch after both the UP and DOWN pulses have returned to an OFF state, wherein the sampling switch controller is configured to receive an advanced reference clock signal and an advanced divider clock signal and to control the sampling switch to close just before the phase comparison operation by the PFD and to open just after the phase comparison operation thereby ensuring that all error charge has been sampled onto the loop filter while simultaneously minimizing a duration for which the loop filter is connected to potential leakage paths in the charge pump; and
a programmable delay coupled to the PFD and configured to receive the advanced reference clock signal and to delay the advanced reference clock signal to produce a reference clock signal,
wherein the PFD is configured to perform the phase comparison operation in response to the reference clock signal.

10. The integrated circuit of claim 9, wherein the sampling switch controller is further configured to adaptively control the width of the sampling interval for a duration based on a length of both the UP and DOWN pulses to the charge pump.

11. The integrated circuit of claim 9, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

12. The integrated circuit of claim 11, wherein the sampling switch controller is further configured to adaptively control the width of the sampling interval as a function of a maximum length of either the UP and DOWN pulses, depending on which of the UP pulse and the DOWN pulse is longest, in a locked condition.

13. The integrated circuit of claim 9, wherein the sampling switch controller is further configured to detect for falling transitions of the UP and DOWN pulses to occur; and in response to detecting the falling transitions of both the UP and DOWN pulses, control the sampling switch to open.

14. The integrated circuit of claim 9, wherein the sampling switch controller is further configured to pre-charge the charge pump output node to the control voltage present at the loop filter prior to a phase comparison operation.

15. The integrated circuit of claim 13, wherein the phase frequency detector (PFD) is further configured to produce the UP and DOWN pulses.

16. The integrated circuit of claim 15, wherein the control voltage from the loop filter to the VCO is further configured to remain constant once the sampling switch is opened until a next cycle where the advanced reference clock signal or the advanced divider clock (whichever occurs first) is turned ON.

17. A device configured to operate with a phase lock loop (PLL) circuit having a phase frequency detector (PFD), a programmable delay coupled to the PFD and configured to receive an advanced reference clock signal and to delay the advanced reference clock signal to produce a reference clock signal, a loop filter, a charge pump to provide an output signal to the loop filter in response to at least one of an UP pulse and a DOWN pulse, and a sampling switch coupled between the loop filter and the charge pump and characterized by a sampling interval, wherein the PFD performs a phase comparison operation in response to the reference clock signal, the device comprising a sampling switch controller configured to adaptively control a width of the sampling interval to mitigate effects of leakage current from the charge pump by:
closing the sampling switch in advance of an ON state of the UP or DOWN pulse, depending on which of the UP pulse and the DOWN pulse occurs first; and
opening the sampling switch after both the UP and DOWN pulses have returned to an OFF state,
wherein the device is further configured to operate with a programmable delay, wherein the sampling switch controller is configured to receive the advanced reference clock signal and an advanced divider clock signal and to control the sampling switch to close just before the phase comparison operation by the PFD and to open just after the phase comparison operation thereby ensuring that all error charge has been sampled onto the loop filter while simultaneously minimizing a duration for which the loop filter is connected to potential leakage paths in the charge pump, the sampling switch controller further being configured to control the sampling switch to close just before the phase comparison operation by the PFD and to open just after the phase comparison operation thereby ensuring that all error charge has been sampled onto the loop filter while simultaneously minimizing a duration for which the loop filter is connected to potential leakage paths in the charge pump.

18. The device of claim 17, wherein the sampling switch controller is further configured to adaptively control the width of the sampling interval for a duration based on a length of both UP and DOWN pulses to the charge pump.

19. The device of claim 17, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

20. The device of claim 19, wherein the sampling switch controller is further configured to adaptively control the width of the sampling interval as a function of a maximum length of either the UP and DOWN pulses, depending on which of the UP pulse and the DOWN pulse is longest, in a locked condition of the PLL circuit.

21. The device of claim 17, wherein the sampling switch controller is further configured to detect for falling transitions of the UP and DOWN pulses to occur; and in response to detecting the falling transitions of both the UP and DOWN pulses, control the sampling switch to open.

22. The device of claim 17, wherein the sampling switch controller is further configured to pre-charge the charge pump output node to the control voltage present at the loop filter prior to phase comparison operation.

23. The device of claim 21, wherein the PLL circuit wherein the phase frequency detector (PFD) in further configured to produce the UP and DOWN pulses.

24. The device of claim 23, wherein the control voltage from the loop filter to the VCO is further configured to remain constant once the sampling switch is opened until a next cycle where the advanced reference clock signal or the advanced divider clock (whichever occurs first) is turned ON.

25. A phase lock loop (PLL) circuit adapted to operate with a sampling switch controller, the PLL circuit comprising:
a loop filter;
a phase frequency detector (PFD) to provide a phase comparison operation and produce the UP and DOWN pulses, and adapted to operate with a programmable delay;
a charge pump to generate an output signal to the loop filter in response to at least one of an UP pulse and a DOWN pulse;
a sampling switch coupled between the loop filter and the charge pump and characterized by a sampling interval;
a sampling switch controller configured to adaptively control a width of the sampling interval to mitigate effects of leakage current from the charge pump by closing the sampling switch in advance of the phase comparison operation and opening the sampling switch when the phase comparison operation is completed; and
a programmable delay coupled to the PFD and configured to receive the advanced reference clock signal and to delay the advanced reference clock signal to produce a reference clock signal,
whereby the sampling switch controller adaptively controls a width of the sampling interval to mitigate effects of leakage current from the charge pump by closing the sampling switch in advance of an ON state of the UP or DOWN pulse, depending on which of the UP pulse and the DOWN pulse occurs first, and opening the sampling switch after both the UP and DOWN pulses have returned to an OFF state, and
wherein the sampling switch controller is configured to receive an advanced reference clock signal and an advanced divider clock signal and to control the sampling switch to close just before the phase comparison operation by the PFD and to open just after the phase comparison operation thereby ensuring that all error charge has been sampled onto the loop filter while simultaneously minimizing a duration for which the loop filter is connected to potential leakage paths in the charge pump; and
wherein the PFD performs the phase comparison operation in response to the reference clock signal.

26. The PLL circuit of claim 25, wherein the control voltage from the loop filter to the VCO is further configured to remain constant once the sampling switch is opened until a next cycle where the advanced reference clock signal or the advanced divider clock signal (whichever occurs first) is turned ON.

27. An apparatus comprising:
a phase lock loop (PLL) circuit;
a phase frequency detector (PFD) to provide a phase comparison operation and produce the UP and DOWN pulses;
means for receiving an advanced reference clock signal and an advanced divider clock signal;
means for delaying the received advanced reference clock signal to produce a reference clock signal to initiate the phase comparison operation by the PFD;
means for closing a sampling switch in advance of an ON state of an UP or DOWN pulse to a charge pump from a phase frequency detector (PFD) of the PLL circuit depending on which of the UP pulse and the DOWN pulse occurs first; and
means for opening the sampling switch after both the UP and DOWN pulses have returned to an OFF state to control a width of a sampling interval of the sampling switch to mitigate effects of leakage current from the charge pump.

28. The apparatus of claim 27, further comprising means for adaptively controlling the width of the sampling interval for a duration based on a length of both UP and DOWN pulses to the charge pump.

29. The apparatus of claim 27, further comprising means for adaptively controlling the width of the sampling interval as a function of a longest length of either the UP and DOWN pulses, depending on which of the UP pulse and the DOWN pulse is longest, to the charge pump during a lock acquisition phase.

30. The apparatus of claim 29, further comprising means for adaptively controlling the width of the sampling interval as a function of a maximum length of either the UP and DOWN pulses, depending on which of the UP pulse and the DOWN pulse is longest, in a locked condition of the PLL circuit.

31. The apparatus of claim 27, further comprising:
means for detecting for falling transitions of the UP and DOWN pulses to occur; and
means for, in response to detecting the falling transitions of both the UP and DOWN pulses, controlling the sampling switch to open.

32. The apparatus of claim 27, further comprising means for pre-charging the charge pump output node to the control voltage present at the loop filter prior to a phase comparison operation.

33. The apparatus of claim 31, further comprising means for controlling the sampling switch to close just before a phase comparison operation by the PFD and to open just after the phase comparison operation thereby ensuring that all error charge has been sampled onto a loop filter of the PLL circuit while simultaneously minimizing a duration for which the loop filter is connected to potential leakage paths in the charge pump.

34. The apparatus of claim 33, further comprising means for holding the control voltage from the loop filter to the VCO constant once the sampling switch is opened until a next cycle where the advanced reference clock signal or the advanced divider clock (whichever occurs first) is turned ON.

35. A method for mitigating the effects of leakage current from a charge pump of a phase lock loop (PLL) circuit, the method comprising:
- receiving an advanced reference clock signal and an advanced divider clock signal;
- delaying the received advanced reference clock signal to produce a reference clock signal;
- comparing phase of the reference clock signal to an input signal;
- producing UP and DOWN pulses based upon the comparison of the reference clock signal to the input signal;
- closing a sampling switch in advance of an ON state of an UP or DOWN pulse to the charge pump from a phase frequency detector (PFD) of the PLL circuit depending on which of the UP pulse and the DOWN pulse occurs first; and
- open the sampling switch after both the UP and DOWN pulses have returned to an OFF state to control a width of a sampling interval of the sampling switch to mitigate the effects of the leakage current from the charge pump of the PLL circuit.

36. The method of claim 35, further comprising controlling the width of the sampling interval for a duration based on a length of both UP and DOWN pulses to the charge pump.

37. The method of claim 35, further comprising controlling the width of the sampling interval as a function of a longest length of either the UP and DOWN pulses, depending on which of the UP pulse and the DOWN pulse is longest, to the charge pump during a lock acquisition phase.

38. The method of claim 37, further comprising controlling the width of the sampling interval as a function of a maximum length of either the UP and DOWN pulses, depending on which of the UP pulse and the DOWN pulse is longest, in a locked condition of the PLL circuit.

39. The method of claim 34, further comprising detecting for falling transitions of the UP and DOWN pulses to occur; and in response to the detecting of the falling transitions of both the UP and DOWN pulses, controlling the sampling switch to open.

40. The method of claim 35, further comprising pre-charging the charge pump output node to the control voltage present at the loop filter prior to PFD phase comparison operation.

41. The method of claim 39, further comprising controlling the sampling switch to close just before a phase comparison operation by the PFD and to open just after the phase comparison operation thereby ensuring that all error charge has been sampled onto a loop filter of the PLL circuit while simultaneously minimizing a duration for which the loop filter is connected to potential leakage paths in the charge pump.

42. The method of claim 41, further comprising holding the control voltage from the loop filter to the VCO constant once the sampling switch is opened until a next cycle where the advanced reference clock signal or the advanced divider clock (whichever occurs first) is turned ON.

* * * * *